(12) United States Patent
Karvonen et al.

(10) Patent No.: US 11,658,611 B2
(45) Date of Patent: May 23, 2023

(54) LOCAL OSCILLATOR BUFFER (71) Applicant: Nordic Semiconductor ASA, Trondheim (NO)

(72) Inventors: Sami Karvonen, Oulu (FI); Pete Sivonen, Oulu (FI)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 17/570,058

(22) Filed: Jan. 6, 2022

(65) Prior Publication Data
US 2022/0224288 A1 Jul. 14, 2022

(30) Foreign Application Priority Data
Jan. 8, 2021 (GB) .................................... 2100264

(51) Int. Cl.
*H03B 5/24* (2006.01)
*H04B 1/403* (2015.01)
(Continued)

(52) U.S. Cl.
CPC ............. *H03B 5/24* (2013.01); *H03F 3/193* (2013.01); *H03F 3/3013* (2013.01); *H03F 3/3022* (2013.01); *H03F 3/3028* (2013.01); *H03F 3/3064* (2013.01); *H04B 1/403* (2013.01); *H03B 2200/0034* (2013.01); *H03F 2200/42* (2013.01);
(Continued)

(58) Field of Classification Search
CPC ............. H03F 2200/42; H03F 2200/69; H03F 2200/75; H03F 2203/45136; H03F 3/3001; H03F 3/193; H03F 3/195; H03F 3/301; H03F 3/3022; H03F 3/3013; H03F 3/3015; H03F 3/3025; H03F 3/3027; H03F 3/3028; H03F 3/3032; H03K 19/018514;
(Continued)

(56) References Cited

U.S. PATENT DOCUMENTS 5,157,349 A  10/1992  Babanezhad
5,210,506 A   5/1993  Koch et al.
(Continued)

FOREIGN PATENT DOCUMENTS

EP  0 509 113 A1  10/1992
FR  3 084 223 A1   7/2018

OTHER PUBLICATIONS

IPO Search Report under Section 17(5) for GB2100264.7, filed on Jan. 8, 2021, dated Mar. 25, 2021, 3 pages.
(Continued)

*Primary Examiner* — Ryan Johnson
(74) *Attorney, Agent, or Firm* — Klarquist Sparkman, LLP (57) ABSTRACT A local oscillator buffer circuit comprises a complementary common-source stage comprising a first p-channel transistor (MCSP) and a first n-channel transistor (MCSN), arranged such that their respective gate terminals are connected together at a first input node, and their respective drain terminals of each of is connected together at a buffer output node. A complementary source-follower stage comprises a second p-channel transistor (MSFP) and a second n-channel transistor (MSFN), arranged such that their respective gate terminals are connected together at a second input node, and their respective source terminals are connected together at the buffer output node.

22 Claims, 9 Drawing Sheets (51) Int. Cl.
*H03F 3/30* (2006.01)
*H03F 3/193* (2006.01)

(52) U.S. Cl.
CPC ...... *H03F 2200/69* (2013.01); *H03F 2200/75* (2013.01)

(58) Field of Classification Search
CPC ... H03K 19/018521; H03K 19/018528; H03B 2200/0034
See application file for complete search history.

(56) References Cited

U.S. PATENT DOCUMENTS

| | | |
|---|---|---|
| 5,786,731 A | 7/1998 | Bales |
| 6,404,293 B1 | 6/2002 | Darabi et al. |
| 2004/0119499 A1 | 6/2004 | Regev |
| 2009/0237125 A1* | 9/2009 | Zhao ................ H03F 3/301 327/108 |
| 2016/0365859 A1* | 12/2016 | Song ................ H03F 3/3033 |

OTHER PUBLICATIONS

Extended European Search Report for EP22150795.7, dated Jun. 9, 2022, 10 pages.

\* cited by examiner

Fig. 1

Prior Art

Fig. 2

Prior Art

LOCAL OSCILLATOR BUFFER

CROSS-REFERENCE TO RELATED APPLICATION

This application claims priority from Great Britain Application No. GB2100264.7, filed Jan. 8, 2021, which application is incorporated herein by reference in its entirety.

TECHNICAL FIELD

The present invention relates to a local oscillator (LO) buffer with a high common-mode rejection capability, particularly though not exclusively to an LO buffer suitable for use in an LO chain within a high-performance radio transceiver.

BACKGROUND OF THE INVENTION

Generally, differential LO generation and distribution chains are used in high-performance radio transceivers in order to provide better balance for the LO signal. Generally, this leads to smaller phase errors in the radio receiver (RX) and/or transmitter (TX) frequency mixer LO ports. Furthermore, using differential circuitry for LO generation typically reduces the coupling of disturbances and interference from the power supply to the desired LO signal.

One component of a typical LO distribution chain is an 'LO buffer', which functions to strengthen (i.e. to amplify) the incoming signal from the frequency synthesizer (SX) and provides the resultant, strengthened signal to the input of a frequency divider (or a bank of frequency dividers). This LO buffer is typically required because, in general, the received LO signal from the SX to RX/TX LO inputs may have weakened in amplitude due to lengthy LO distribution line between the SX and RX/TX blocks on RFIC. The length at which this becomes problematic varies depending on implementation, but may be for instance in the order of 1-2 mm.

The LO buffer serves to amplify the received LO signal and is generally required to ensure the proper operation of the frequency divider and also to reduce the phase noise contribution of blocks following the LO buffer to the overall LO generation noise budget. The lengthy LO line can also gather unwanted disturbance and introduce spurs to the receiving LO buffer input via inductive or capacitive coupling.

In addition to amplifying the wanted differential LO input signal with low phase noise, it would be desirable for the LO buffer to attenuate any unwanted common-mode content at the buffer input and to reduce any possible phase errors generated in the preceding LO line and SX blocks, so as to improve the balance of the differential LO signal.

SUMMARY OF THE INVENTION

When viewed from a first aspect, the present invention provides a local oscillator buffer circuit comprising:

- a complementary common-source stage comprising a first p-channel transistor and a first n-channel transistor, arranged such that a respective gate terminal of each of the first p-channel and n-channel transistors are connected together at a first input node, and a respective drain terminal of each of the first p-channel and n-channel transistors are connected together at a buffer output node; and
- a complementary source-follower stage comprising a second p-channel transistor and a second n-channel transistor, arranged such that a respective gate terminal of each of the second p-channel and n-channel transistors are connected together at a second input node, and a respective source terminal of each of the second p-channel and n-channel transistors are connected together at the buffer output node.

Thus it will be appreciated that embodiments of the present invention provide an improved LO buffer circuit, suitable for use in a local oscillator (LO) chain that uses a complementary common-source (CS) stage and a complementary source-follower (SF) stage arranged in a configuration such that the input voltage may be supplied across the input nodes (e.g. where the positive input is connected to the first input node and the negative input is connected to the second input node, or vice versa), and the output node is common to both stages. The term 'complementary' as used herein will be understood to mean an arrangement of both p- and n-type devices. The complementary CS and complementary SF stages may be complementary metal-oxide-semiconductor (CMOS) stages.

Advantageously, a buffer circuit in accordance with embodiments of the present invention may provide significant improvements in the common-mode rejection (CMR) of the LO buffer when used as a part of LO chain in a high-performance transceiver. The attenuation of common-mode signals in the LO buffer may result in smaller phase errors in the subsequent frequency dividers which in turn improves image-rejection or harmonic-rejection capability of RF mixers in the receiver (RX) and/or transmitter (TX) paths. In addition, the rejection of common-mode signals in the LO chain may reduce the generation of unwanted spurs and sidebands at the output of the RF mixers. Reduced phase errors may result in improved image rejection, which is an important parameter in e.g. 'Long Term Evolution' (LTE) transmitters and is a parameter explicitly specified by 3GPP for LTE transmitters.

The LO buffer topology of the present invention is particularly well-suited for integration in modern CMOS fabrication processes with low power supply voltages because it uses relatively simple CMOS gain stages that can support rail-to-rail CMOS level signals. This is a benefit that is not found in conventional LO buffers, known in the art per se, that are for example implemented with current-mode logic (CML) which generally necessitates higher supply voltages, especially if resistive loads are used for the buffers. Thus the LO buffer of the present invention may advantageously have lower power consumption than a CML-based LO buffer offering the same noise performance.

Furthermore, the LO buffer of the present invention has improved phase error correcting properties. Input phase error is defined here as the deviation of the phase difference between the positive (VINP) and negative (VINN) branches of the differential LO signal from the ideal 180° phase shift. For example, a +10° phase error corresponds to a 190° phase shift between the two differential input signal branches. Similarly, a −10° phase error corresponds to a 170° phase shift between the two differential input signal branches.

As is described in detail later in respect of a particular non-limiting embodiment, it can be seen using simulation techniques that a LO buffer in accordance with embodiments of the present invention may be able to, by way of example only, correct an input phase error of ±45° significantly to an output phase error of approximately ±5°. The simulated common-mode rejection ratio for the example buffer was approximately 20 dB.

The Applicant has appreciated that the inclusion of the SF stage in the LO buffer topology of the present invention may result in a higher power consumption and area compared to a simple common-source LO buffer, known in the art per se, for a given phase noise performance. However, this increased power consumption is, in practice negligible, and it comes at a trade-off for the superior common-mode rejection capability compared to a simple prior art common-source buffer. Furthermore, the provision of the SF stage removes the need for a CML buffer (and the associated fixed DC current biasing) or other similar common-mode rejection techniques, thus allowing the use of lower power supply voltages. This may result in lower overall power consumption, despite the addition of the SF stage.

The transistors used to implement the LO buffer circuit may, in some embodiments, comprise metal-oxide-semiconductor (MOS) devices. As will be appreciated by those skilled in the art, the p-channel and n-channel MOS devices will each have an associated transconductance $g_m$. The Applicant has appreciated that the greater the 'matching' between the sum of the transconductances of the transistors in the complementary CS stage and the sum of the transconductances of the transistors in the complementary SF stage, the greater the CMRR of the LO buffer circuit. The term 'matching' as used in this context means that the sums of transconductances are numerically close, and ideally are equal (or as close to equal as possible). It will be appreciated that the term 'mismatch' as used herein in respect of these transconductances means the deviation of the sum of CS $g_{mcs}$ transconductances from the sum of SF transconductances $g_{msf}$. In some embodiments a mismatch between the sum of the transconductances of the transistors in the complementary CS stage and the sum of the transconductances of the transistors in the complementary SF stage is less than 25%. In other words, in such embodiments, this relationship may be expressed mathematically as $0.75 < g_{msf}/g_{mcs} < 1.25$.

In a particular set of embodiments, the sum of the transconductances of the transistors in the complementary CS stage is substantially equal to the sum of the transconductances of the transistors in the SF stage. In other words, the sum of the transconductances of the first p-channel and n-channel transistors may be substantially equal to the sum of the transconductances of the second p-channel and n-channel transistors. In a fully differential arrangement, the sum of the transconductances in the second complementary CS stage (i.e. the 'third' p- and n-channel transistors) is preferably substantially equal to the sum of the transconductances in the second complementary SF stage (i.e. the 'fourth' p- and n-channel transistors). In some such embodiments, the sums of the transconductances in each of the complementary CS and SF stages is substantially equal.

In an alternative set of embodiments, however, the sum of the respective transconductances of the first p-channel transistor and the first n-channel transistor may be greater than a sum of the respective transconductances of the second p-channel transistor and the second n-channel transistor. In other words, the sum of the transconductances in the complementary CS stage may be greater than the sum of the transconductances in the SF stage. Having the sum of the transconductances of the complementary CS stage greater than those of the SF stage may increase the differential mode gain in exchange for a lower CMRR. In a fully differential arrangement, the sum of the transconductances in the second complementary CS stage (i.e. the 'third' p- and n-channel transistors) may be greater than the sum of the transconductances in the second complementary SF stage (i.e. the 'fourth' p- and n-channel transistors). In some such embodiments, the sums of the transconductances in each of the CS stages may be substantially equal, and/or the sums of the transconductances in each of the SF stages may be substantially equal.

In addition, the actual common-mode rejection ratio that the buffer of the present invention realizes may, in practice, depend on transistor matching and process variation. However, those skilled in the art will appreciate that relative good transistor matching can be achieved in modern CMOS integrated circuit processes with careful layout design and/or the use of slightly increased MOS device sizes compared to the minimum allowed by the technology.

It will be appreciated that, in general, the gain of a complementary CS stage is negative-signed, and thus it acts as an inverting amplifier (or 'inverting buffer').

Conversely, the gain of a complementary SF stage is positive-signed, and thus it acts as a non-inverting amplifier (or 'non-inverting buffer'). Thus the first input node (i.e. the input to the complementary CS stage) and the second input node (i.e. the input to the complementary SF stage) are 'inverses' of one another, such that a differential input may be applied across these input nodes. It will be appreciated that the differential input comprises a 'positive' signal and a 'negative' signal, wherein one is applied to one input node, and the other is applied to the other input node. It will be appreciated that in differential implementations, the inverted signal (i.e. the 'negative' signal) is generally readily available due to the inherent nature of differential circuitry.

The buffer circuit may be arranged to provide fully differential operation. In a particular set of embodiments, the buffer circuit further comprises:

a second complementary common-source stage comprising a third p-channel transistor and a third n-channel transistor, arranged such that a respective gate terminal of each of the third p-channel and n-channel transistors are connected together at a third input node, and a respective drain terminal of each of the third p-channel and n-channel transistors are connected together at a second buffer output node; and a second complementary source-follower stage comprising a fourth p-channel transistor and a fourth n-channel transistor, arranged such that a respective gate terminal of each of the fourth p-channel and n-channel transistors are connected together at a fourth input node, and a respective source terminal of each of the fourth p-channel and n-channel transistors are connected together at the second buffer output node;

wherein the buffer circuit is arranged to receive a differential input comprising a positive input signal and a negative input signal, wherein the positive input signal is supplied to the first and fourth input nodes, and wherein the negative input signal is supplied to the second and third input nodes.

It will be appreciated that in such embodiments, each of the positive and negative inputs is supplied to a complementary CS stage and a complementary SF stage. Specifically, the positive input is supplied to the first complementary CS stage and the second complementary SF stage, while the negative input is supplied to the second complementary CS stage and the first complementary SF stage. The complementary CS and SF stages are therefore 'paired', such that the first complementary CS and SF stages work together to supply the negative output signal, and such that the second complementary CS and SF stages work together to supply the positive output signal.

It will be appreciated that the terms 'positive' and 'negative' are used for ease of reference and could be exchanged for one another. However, it should be noted that as a result of the design, the sign of the output signal from each pair will be the same as the sign of the input signal to the complementary SF stage in that pair (and, equivalently, the opposite of the sign of the input signal to the complementary CS stage of that pair).

In general, the 'common' terminals of the transistors (i.e. the source terminals in the common-source stages and the drain terminals in the source-follower—sometimes referred to as a 'common drain' circuit—stages) are connected to a suitable reference voltage or supply rail. In some embodiments, a source terminal of the first p-channel transistor is connected to a positive supply rail. In some potentially overlapping embodiments, a source terminal of the first n-channel transistor is connected to a negative supply rail or ground. In a set of potentially overlapping embodiments, a drain terminal of the second n-channel transistor is connected to the positive supply rail. In some potentially overlapping embodiments, a drain terminal of the second p-channel transistor is connected to the negative supply rail or ground.

Typically, the stages of the buffer circuit may be provided with suitable biasing circuitry to provide the desired operating characteristics. In some embodiments, the common-source stage comprises a bias resistor connected to the first input terminal. In a differential circuit, a bias resistor may similarly be connected to the respective input terminal of the second complementary common-source stage.

The bias resistor in the complementary common-source stage (or each bias resistor in each of the complementary common-source stages, as appropriate) has one terminal of the resistor connected to the input node of that common-source stage. The other terminal of the bias resistor may be connected to a common-source stage bias voltage, where this bias voltage and the resistance of the corresponding bias resistor may be selected as appropriate.

However, in some embodiments, the second terminal of the bias resistor in the common-source stage (i.e. the terminal not connected to the input node) may be connected to the buffer output node. Such a 'feedback-based' arrangement may advantageously provide the common-source stage with a 'self-biasing' function.

The complementary source-follower stage(s) may also generally be provided with a suitable biasing arrangement. In some embodiments, the gate terminal of the second p-channel transistor is connected to a respective bias voltage via a respective bias resistor. Similarly, the gate terminal of the second n-channel transistor is connected to a respective bias voltage via a respective bias resistor.

The bias voltages and resistances of the resistors may be selected as appropriate. In a particular set of embodiments, the gate terminal of the n-channel transistor in the complementary source-follower stage (i.e. the 'second' n-channel transistor) is connected to the positive supply rail via the corresponding resistor. Similarly, in a potentially overlapping set of embodiments, the gate terminal of the p-channel transistor in the complementary source-follower stage (i.e. the 'second' p-channel transistor) is connected to the negative supply rail or ground via the corresponding resistor. This may apply equally to the transistors (i.e. the 'fourth' n- and p-channel transistors) in the second complementary source-follower stage in fully differential arrangements in a particular set of embodiments. Using the positive supply rail and negative supply rail or ground in this way may advantageously simplify the design of the biasing arrangement for the complementary source-follower stage(s).

In some embodiments, the complementary common-source stage comprises an input capacitor having a first terminal thereof connected to the respective gate terminals of the first p-channel and n-channel transistors. The other terminal of the capacitor may be connected to an input terminal arranged to receive the input signal for the complementary common-source stage. In fully differential embodiments in which a second complementary common-source stage is provided, the 'third' p-channel and n-channel transistors may similarly be provided with such an input capacitor. Such an input capacitor may provide 'AC coupling', such that the wanted RF LO signals pass into the complementary CS stage of the LO buffer, i.e. DC signals are blocked.

While the gate terminals of the transistors in the source-follower stage could be directly connected to the second input node, generally the transistors (MSFN and MSFP) in the source-follower stage may require different DC voltages or bias voltages ($V_{bias\_sfn}$ and $V_{bias\_sfp}$, respectively), to work properly. As such, the source-follower stage may also comprise one or more input capacitors, thereby providing AC coupling to the SF stage and allowing for proper biasing of the SF transistors. Thus the gate terminals of the second p- and n-channel transistors may be connected to the second input node via the respective input capacitors. In some embodiments, the complementary source-follower stage comprises respective first and second input capacitors, wherein the first input capacitor is connected to the gate terminal of the second n-channel transistor, and the second input capacitor is connected to the gate terminal of the second p-channel transistor. The other terminals of these input capacitors (i.e. the terminals not connected to the gates of the source-follower transistors) may be connected to an input terminal arranged to receive the input signal for the complementary source-follower stage. In fully differential embodiments in which a second complementary source-follower stage is provided, the 'fourth' p-channel and n-channel transistors may similarly be provided with such respective input capacitors in the same manner as the first complementary source-follower stage.

It will be appreciated that the term 'connected' as used herein means that a transmission path is provided for radio frequency (RF) signals, and thus while the provision of a capacitor may block DC or low frequency signals from passing through such a capacitor, the term 'connected' is intended to cover such a path. This is because, at radio frequency (RF), the in-line capacitors act ideally as short circuits. By way of example, in the set of embodiments described above in which input capacitors $C_{in\_sfn}$ and $C_{in\_sfp}$ are provided at the gate terminals of the transistors in the complementary source-follower stage, the respective gate terminals of each of the second p-channel and n-channel transistors are connected together at the second input node from the perspective of RF frequencies. This applies equally to a set embodiments in which second complementary CS and SF stages are provided as outlined herein, where the third and fourth transistors may each be provided with respective input capacitors.

A load may be connected to the buffer output node and thus, in some embodiments, the buffer circuit further comprises a load connected to the buffer output node. This load may comprise a load conductance ($Y_L$).

The present invention extends to a radio communication circuit that utilises an LO chain including an LO buffer circuit in accordance with any of the embodiments of the first aspect of the invention as outlined above.

Thus, when viewed from a second aspect, the present invention provides a radio communication circuit comprising:

a frequency synthesizer arranged to generate a local oscillator signal comprising a positive local oscillator input signal and a negative local oscillator input signal;

a local oscillator buffer circuit comprising:

a complementary common-source stage comprising a first p-channel transistor and a first n-channel transistor, arranged such that a respective gate terminal of each of the first p-channel and n-channel transistors are connected together at a first input node arranged to receive the positive local oscillator input signal, and a respective drain terminal of each of the first p-channel and n-channel transistors are connected together at a buffer output node; and a complementary source-follower stage comprising a second p-channel transistor and a second n-channel transistor, arranged such that a respective gate terminal of each of the second p-channel and n-channel transistors are connected together at a second input node arranged to receive the negative local oscillator input signal, and a respective source terminal of each of the second p-channel and n-channel transistors are connected together at the buffer output node.

In some embodiments of this second aspect of the invention, the local oscillator buffer circuit may be fully differential, comprising a second complementary common-source stage and a second complementary source-follower stage as outlined hereinabove. In such embodiments, the negative local oscillator input signal may be provided to the input node of the second complementary common-source stage and the positive local oscillator input signal may be provided to the input node of the second complementary source-follower stage.

The radio communication circuit may further comprise a frequency divider connected to the output of the LO buffer circuit. The frequency divider may be a divide-by-N frequency divider. In a particular set of embodiments, the frequency divider is a divide-by-two frequency divider arranged to receive positive and negative local oscillator signal outputs from the LO buffer and to generate four resultant signals: a positive in-phase LO signal; a negative in-phase LO signal; a positive quadrature LO signal; and a negative quadrature LO signal. In other words, there may be four signals, suitable for in-phase and quadrature (I/Q) mixers, as outlined below. The frequency divider may, in some embodiments, be connected directly to the output of the LO buffer circuit. However, in some embodiments, one or more further buffer stages (which may be conventional buffers), such as a common-source buffer may be connected between the frequency divider and the output of the LO buffer circuit. The provision of such additional buffer stage(s) may further strengthen the received LO signal.

The signals generated by the frequency divider may be provided to a frequency mixer, which may be included in the radio communication circuit. These may be provided directly, however in some embodiments the radio communication circuit comprises one or more local buffers (referred to as 'I/Q mixer local buffers') arranged to buffer the signals from the frequency divider before providing these to the frequency mixer. In some such embodiments, a buffer is provided for each of the signals from the frequency mixer, i.e. the radio communication circuit may comprise four I/Q mixer local buffers.

The radio communication circuit may comprise a radio receiver circuit and/or a radio transmitter circuit, and in some embodiments comprises a radio transceiver circuit arrange to both transmit and receive radio signals. The radio transceiver may, for example, comprise an LTE transceiver, and may be part of e.g. a portable electronic device, such as an LTE 'user equipment' (UE) device. Particularly, although not exclusively, such an LTE transceiver may be part of an 'Internet of Things' (IoT) device arranged to communicate using a suitable LTE standard e.g. narrowband-IoT (NB-IoT) or enhanced machine-type communications (eMTC).

It will be appreciated that the optional features described above in relation to any aspect of the invention also apply to the other aspect(s) of the invention as appropriate.

BRIEF DESCRIPTION OF THE DRAWINGS

Certain embodiments of the present invention will now be described with reference to the accompanying drawings, in which.

DETAILED DESCRIPTION

Figure 1:
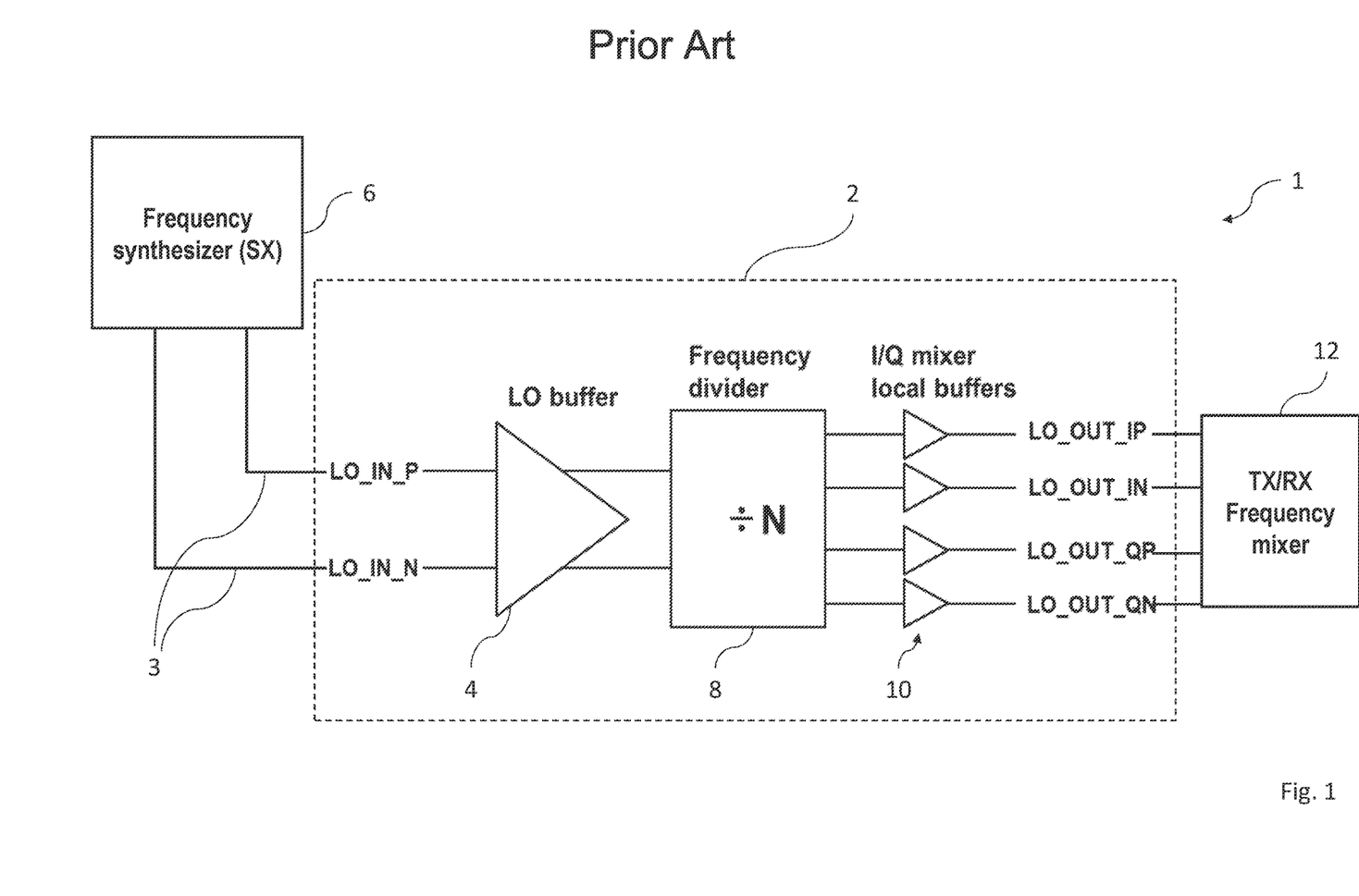
FIG. 1 is a block diagram of a prior art LO chain.

FIG. 1 is a block diagram illustrating a typical prior art radio transceiver 1 comprising a differential LO chain 2 that includes an LO buffer 4. This differential LO chain 2 may, for example, be used in a high-performance radio transceiver. Typically, differential circuitry is used for LO generation in order to reduce the coupling of disturbances from the power supply (not shown) to the wanted LO signal.

The LO buffer 4 is provided within the differential LO distribution chain 2 to strengthen (i.e. to amplify) the incoming signal LO_IN_P, LO_IN_N provided by a frequency synthesizer (SX) 6. The LO buffer 4 provides these strengthened LO signals to the input of a frequency divider 8 (or to a bank of frequency dividers as appropriate). The frequency divider 8 divides the buffered LO signals into four signals, which are each passed through a respective I/Q mixer local buffer 10. The resultant buffered signals may be: an in-phase positive signal LO_OUT_IP; an in-phase negative signal LO_OUT_IN; an quadrature positive signal LO_OUT_QP; and an quadrature negative signal LO_OUT_ON. These signals (i.e. the outputs of the I/Q mixer local buffers 10) are then suitable for output to a transmitter and/or receiver (TX/RX) frequency mixer 12.

In arrangements in which the LO distribution line 3 (i.e. from the SX 6 to the LO chain 2) is sufficiently long (e.g. 1-2 mm), the signals LO_IN_P, LO_IN_N from the SX 6 may have significantly weakened in amplitude. The LO buffer 4 serves to ensure the proper operation of the frequency divider 8 and also to minimize the phase noise contribution of blocks following the LO buffer 4 to the overall LO generation noise budget. The lengthy LO line 3 can also gather unwanted disturbance and spurs to the receiving LO buffer 4 input via inductive or capacitive coupling.

In addition to amplifying the wanted differential LO input signal with low phase noise, it is desirable for the LO buffer 4 to attenuate any unwanted common-mode content at the input to the buffer 4 and to reduce possible phase errors generated in preceding LO line 3 and SX 6 to improve balance of the differential LO signal. Conventional topologies, known in the art per se, typically used for the LO buffer 4 are described below with reference to FIGS. 2 and 3 but these do not generally provide sufficient common-mode rejection characteristics.

Figure 2:
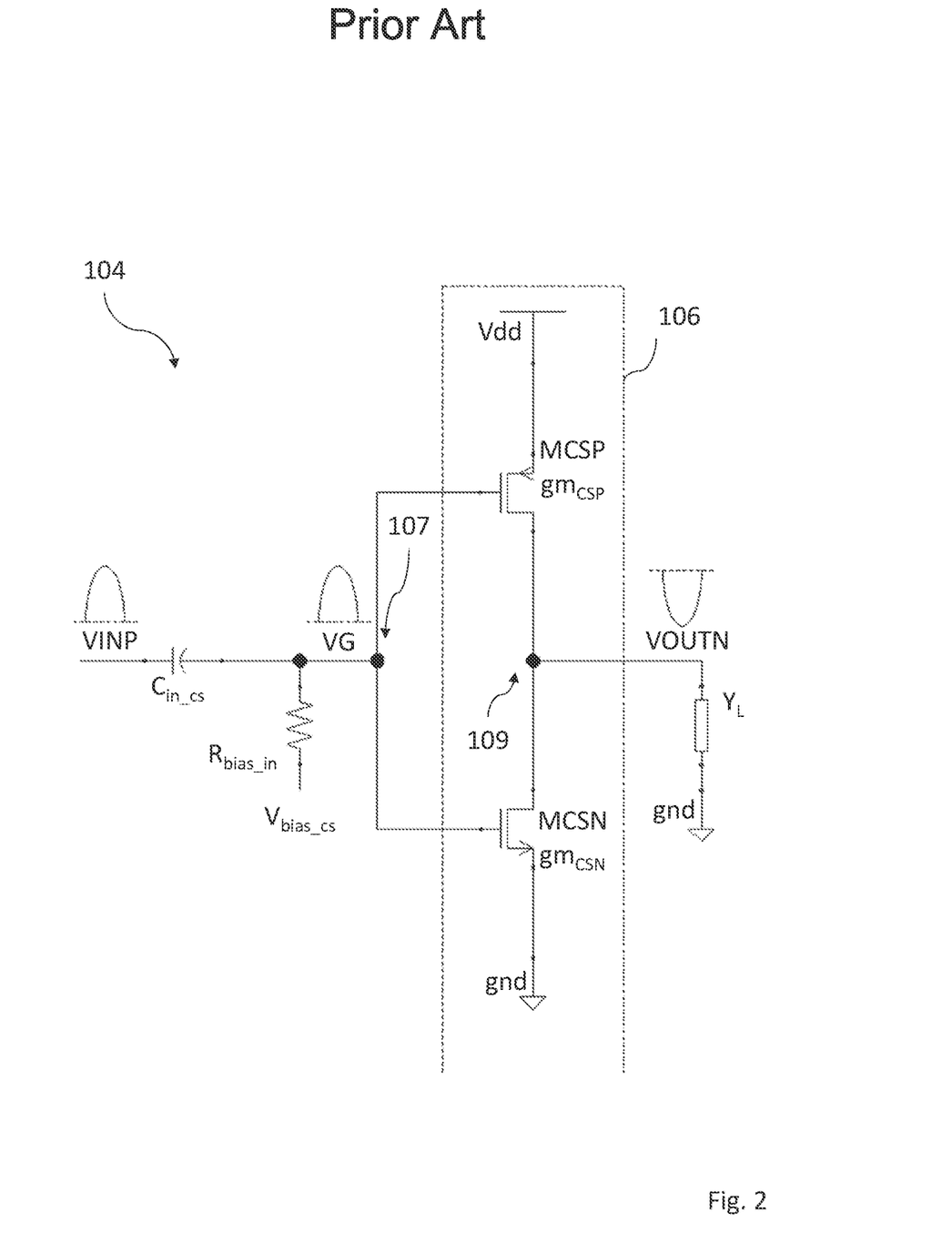
FIG. 2 is a circuit diagram of a prior art CS LO buffer.

FIG. 2 is a circuit diagram of a prior art LO buffer 104 based on a complementary MOS (CMOS) common-source (CS) amplifier stage 106, also known as CMOS inverter. For ease of reference, a single-ended version of the LO buffer 104 is shown, however in practice a fully or pseudo-differential implementation may be used for better performance.

The complementary CS stage 106 is constructed from a p-channel MOS transistor MCSP and an n-channel MOS transistor MCSN, arranged to form a CS amplifier.

Specifically, the source terminal of MCSP is connected to the positive supply rail Vdd, and the source terminal of MCSN is connected to ground gnd. The gate terminals of MCSP and MCSN are connected together at an input node 107 that receives a gate voltage VG, which is derived from the positive input voltage VINP, as discussed below. The drain terminals of MCSP and MCSN are connected together at an output node 109, which provides the negative output voltage VOUTN. In practice, a differential circuit using this topology would have another identical complementary CS stage in which the gates receive a voltage derived from the negative input voltage VINN (not shown) and provide the positive output voltage VOUTP (not shown).

The presented CS buffer 104 is AC coupled due to the input capacitor $C_{in\_cs}$, which is positioned between the terminal that receives the positive input voltage VINP and the node connected to the gate terminals of MCSP and MCSN. This capacitor $C_{in\_cs}$ allows the wanted RF LO signal to pass into the buffer 104 while blocking DC signals.

In the complementary CS-based buffer 104 of FIG. 2, the gates of the NMOS/PMOS transistors MCSN/MCSP are DC biased with a resistor $R_{bias\_in}$ to a voltage $V_{bias\_cs}$ close to the half of the supply voltage (Vdd), i.e. Vdd/2.

The gain of the complementary CS buffer for small input signals can be approximately calculated as per Equation 1 below:

Gain of the CS buffer for small input signals $$G = \frac{V_{OUTN}}{V_{INP}} \approx -\frac{g_{m\_CSP} + g_{m\_CSN}}{Y_L + g_{ds\_CSP} + g_{ds\_CSN}} \quad \text{Equation 1}$$

where $g_{m\_CSP}$ and $g_{m\_CSN}$ are the small-signal transconductances of the PMOS/NMOS transistors MCSP and MCSN respectively; and $g_{ds\_CSP}$ and $g_{ds\_CSN}$ are their corresponding small-signal output conductances. Additionally, $Y_L$ is the admittance of the load that the LO buffer 104 is driving.

The gain of the complementary CS buffer 104 is negative-signed and it thus inverts the incoming LO RF signal to its output.

Figure 3:
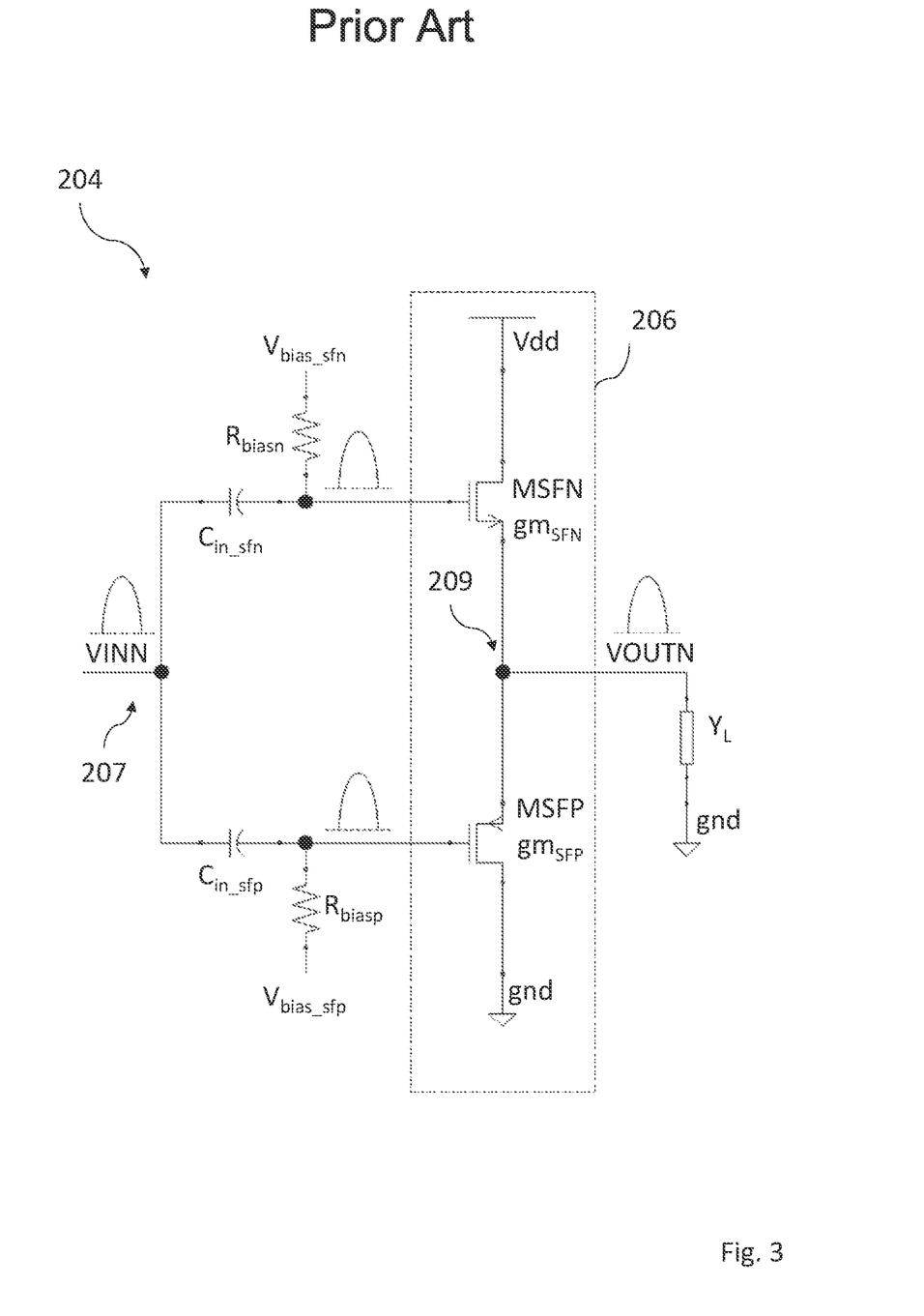
FIG. 3 is a circuit diagram of a prior art SF LO buffer.

FIG. 3 illustrates simplified schematic of LO buffer 204 based on a CMOS source-follower (SF) amplifier stage 206. Again, for ease of illustration, a single-ended version of the LO buffer 204 is shown, but a fully or pseudo-differential implementation is generally preferred for better performance.

The complementary SF stage 206 is constructed from a p-channel MOS transistor MSFP and an n-channel MOS transistor MSFN, arranged to form a complementary SF amplifier. Specifically, the drain terminal of MSFN is connected to the positive supply rail Vdd, and the drain terminal of MSFP is connected to ground gnd.

The gate terminals of MSFP and MSFN are each connected to an input node 207 that receives the negative input voltage VINN via respective input capacitors $C_{in\_sfp}$ and $C_{in\_sfn}$. These capacitors $C_{in\_sfp}$, $C_{in\_sfn}$ provide the SF buffer stage 206 with AC coupling at the input, thus allowing only the wanted RF LO signal to pass into the buffer 204.

Additionally, in the complementary SF stage 206 of the buffer 204, the gate terminals of the transistors MSFN and MSFP are DC biased with dedicated respective resistors Rbiasn and Rbiasp. These resistors Rbiasn and Rbiasp are connected between the gate terminal of the corresponding transistor MSFN, MSFP and the dedicated bias voltage, $V_{bias\_sfn}$ and $V_{bias\_sfp}$, respectively.

The gain of the SF buffer for small input signals can be approximately calculated as per Equation 2 below:

Gain of the SF buffer for small input signals $$G = \frac{V_{OUTN}}{V_{INN}} \approx \frac{g_{m\_SFP} + g_{m\_SFN}}{Y_L + g_{m\_SFP} + g_{m\_SFN}} \quad \text{Equation 2}$$

where $g_{m\_SFP}$ and $g_{m\_SFN}$ are small-signal transconductances of MSFP and MSFN respectively, and $Y_L$ is the admittance of the load that the LO buffer 204 is driving.

Note that in Equation 2 above, it is assumed that the output conductances of the transistors MSFP, MSFN are much smaller than their transconductances and can thus be omitted.

The gain of the complementary SF-based buffer 204 is positive-signed and thus the output signal VOUTN of the buffer at the output node 209 is approximately in-phase with the incoming input signal at node VINN. In practice, a differential circuit using this complementary SF-based topology would have another identical complementary SF stage in which the gates receive a voltage derived from the positive input voltage VINP (not shown) and provide the positive output voltage VOUTP (not shown).

Figure 4A:
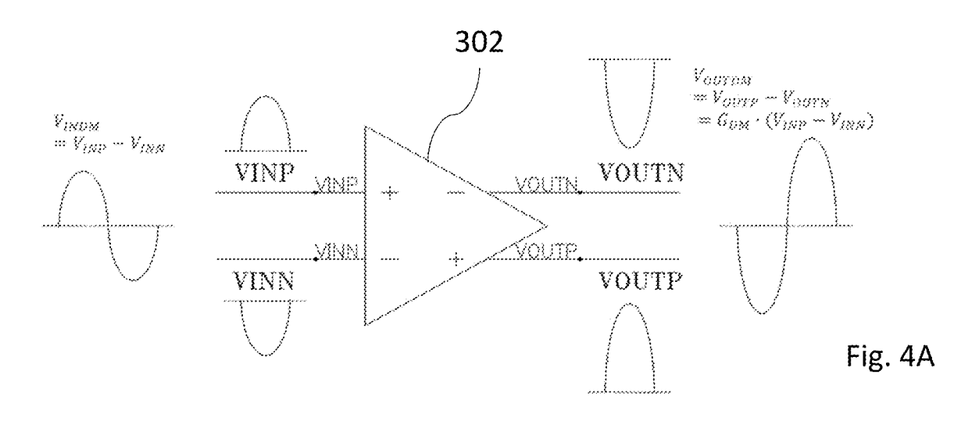
FIGS. 4A and 4B are schematic diagrams illustrating the differential-mode and common-mode gains of a differential LO buffer.
Figure 4B:
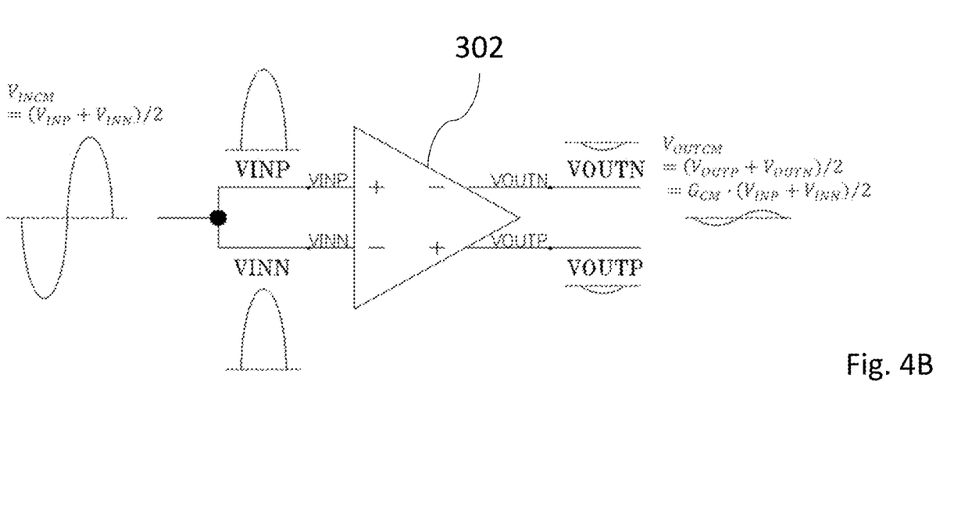

FIGS. 4A and 4B are schematic diagrams illustrating the differential-mode and common-mode gains of a differential LO buffer 302, e.g. of a type generally suitable for use as the LO buffer 4 in the LO chain 2 arrangement of FIG. 1. A simple differential LO buffer can be constructed for example by having two CMOS CS buffers of FIG. 2 or two CMOS SF buffers of FIG. 3 arranged in a pseudo-differential configuration, in a manner known in the art per se.

The differential-mode (DM) gain $G_{DM}$ can be readily understood with reference to FIG. 4A and is a desirable feature for the LO buffer 302. This DM gain $G_{DM}$ should be maximized in order to strengthen the desired differential LO signal and thus maximize the signal to phase noise ratio in the subsequent LO chain.

On the contrary, the gain $G_{CM}$ for common-mode (CM) signals at the input of the LO buffer 302, which can be understood with reference to FIG. 4B, should be minimized in order to reject common-mode signals propagating to the subsequent LO blocks. For example, strong common-mode content in differential LO signal at the input of a frequency divider (e.g. the frequency divider 6 of FIG. 1) can cause unwanted phase errors at the divider output which will degrade image rejection of a subsequent mixer (e.g. the mixer 12 of FIG. 1). Furthermore, common-mode spurs propagated throughout the whole LO chain can cause unwanted mixing products to appear at the mixer output thus degrading the performance of the mixer.

Due to the issues outlined above, the common-mode rejection ratio (CMRR) of an LO buffer in high-performance transceiver should be as high as possible, where CMRR=$|G_{DM}/G_{CM}|$. However, this is not a property of conventional arrangements known in the art per se. For example, a simple pseudo-differential LO buffer constructed of a single-ended CMOS CS buffer in each of the differential branches does not, in practice, have any common-mode rejection because the gains for differential and common-mode signals are equal (i.e. $G_{DM}=G_{CM}$), where these gains are given by Equation 1.

One simple way of trying to improve LO buffer CMRR that is used in conventional approaches is to use a differential pair arrangement with a fixed tail bias current source and resistive or inductive loads. Such an approach is generally known as a current-mode logic (CML) buffer topology. However, the common-mode rejection capability of a current-biased differential pair is severely limited at high frequencies and using especially resistive loads for the buffer makes such an approach ill-suited for low-voltage design.

Thus, a differential or pseudo-differential buffer with different gains for DM and CM signals and suitability for low-voltage CMOS design is of interest.

Figure 5A:
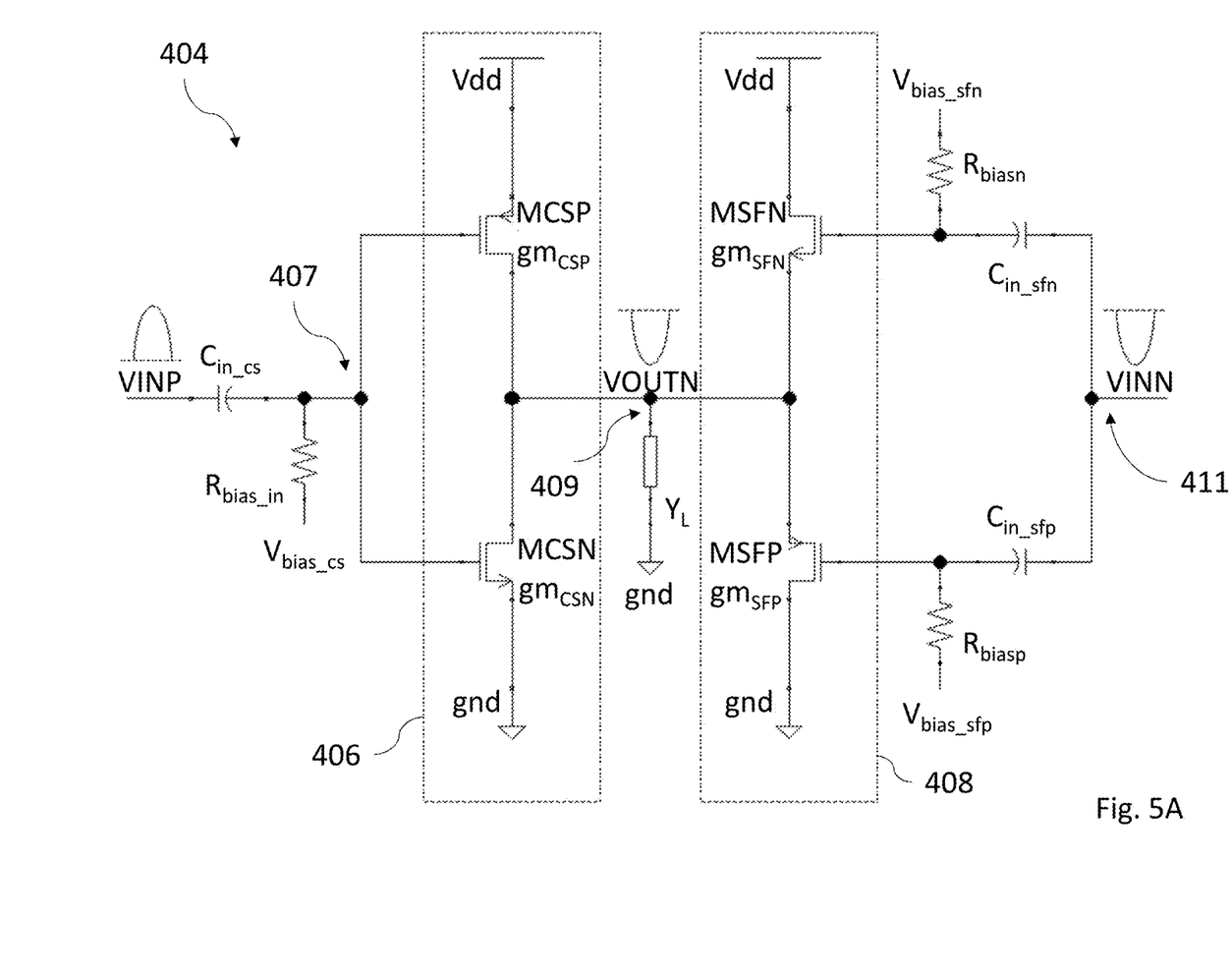
FIGS. 5A and 5B are circuit diagrams of an LO buffer circuit in accordance with an embodiment of the present invention.
Figure 5B:
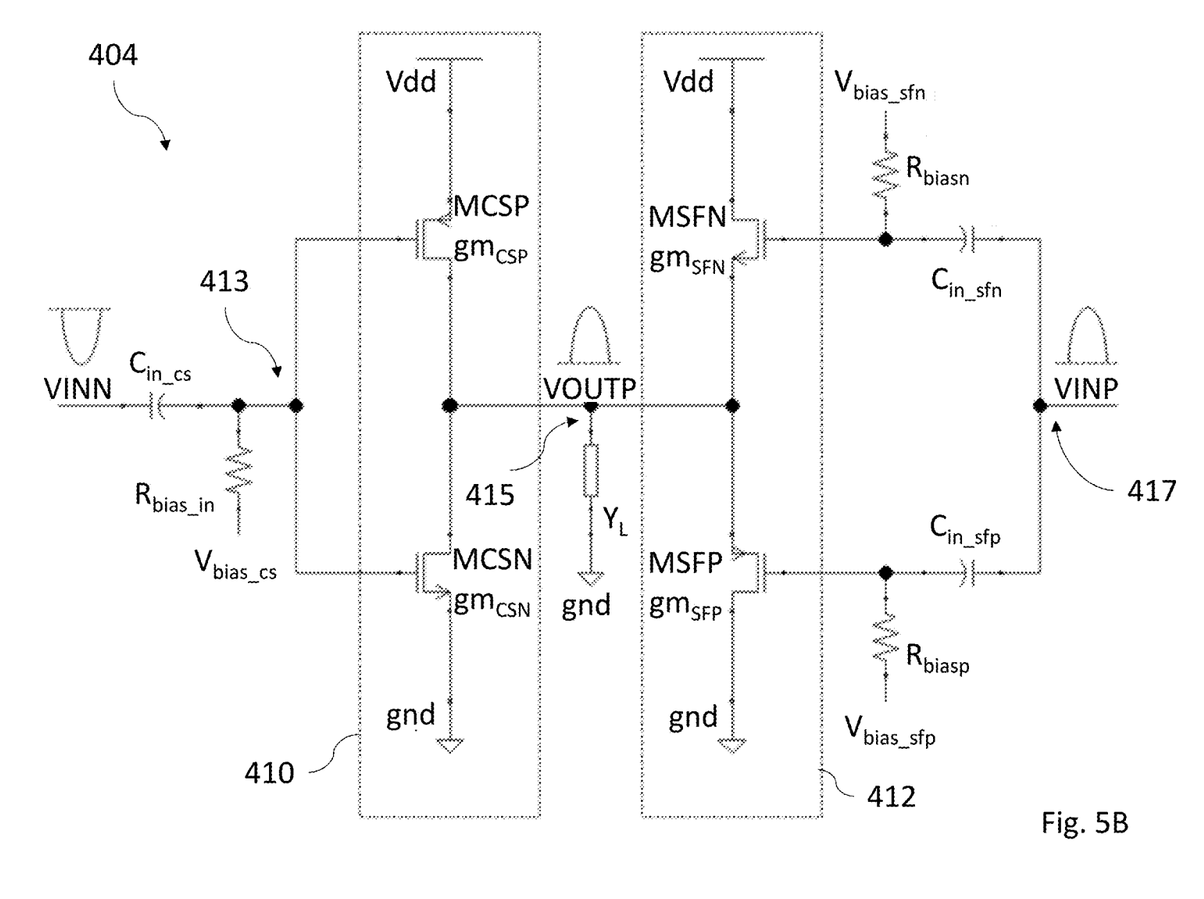

FIGS. 5A and 5B are circuit diagrams of a CMOS LO buffer 404 with high common-mode rejection capability in accordance with an embodiment of the present invention. Each of FIGS. 5A and 5B show only one half of a fully differential implementation, however each of the two arrangements is identical, except for the signals input and output from each, as outlined below. The arrangements in FIGS. 5A and 5B are arranged in a pseudo-differential arrangement in order to achieve fully differential operation.

As can be seen in FIG. 5A, 'first half' of the LO buffer 404 has both a complementary common-source gain stage 406 and a complementary source-follower gain stage 408 driving the output load $Y_L$ in parallel. The input of the SF gain stage 408 is driven at its input node 411 with a signal that is inverted compared to the signal provided at the input node 407 of the CS gain stage 406. Specifically, the positive LO input voltage VINP is provided to the input of the CS gain stage 406 and the negative LO input voltage VINN is provided to the input of the SF gain stage 408. In a differential implementation, the inverted signal VINN is readily available due to the inherent nature of differential circuitry. This first half of the buffer 404 provides the negative LO output signal VOUTN at its output node 409 (i.e. the phase of the first half matches the phase of the input to the SF gain stage 408 and is opposite to the phase of the input to the complementary CS gain stage 406).

The 'second half' of the fully differential LO buffer 404 can be seen in FIG. 5B and is identical in structure to the first half of FIG. 5A, except that the negative LO input voltage VINN is provided at the input node 413 of the second complementary CS gain stage 410 and the positive LO input voltage VINP is provided at the input node 417 of the second complementary SF gain stage 412, where the signal at the output node 415 of this 'flipped' circuit is the positive LO output signal VOUTP.

The negative output signal VOUTN of the buffer 404 for small input signals can be approximately calculated as per Equation 3 below:

The negative output signal
VOUTN of the buffer 404 for small input $$V_{OUTN} \approx \frac{(g_{m\_SFP} + g_{m\_SFN})V_{INN} - (g_{m\_CSP} + g_{m\_CSN})V_{INP}}{Y_L + g_{m\_SFP} + g_{m\_SFN} + g_{ds\_CSP} + g_{ds\_CSN}}$$ Equation 3

Assuming that the transconductances $g_{m\_SFP}$ and $g_{m\_SFN}$ of the complementary SF stage transistors MSFP and MSFN are much larger than the output conductances $g_{ds\_CSP}$ and $g_{ds\_CSN}$, Equation 3 simplifies as per Equation 4 below:

Simplification of the negative output signal
VOUTN of the buffer 404 for small input signals $$V_{OUTN} \approx \frac{(g_{m\_SFP} + g_{m\_SFN})V_{INN} - (g_{m\_CSP} + g_{m\_CSN})V_{INP}}{Y_L + g_{m\_SFP} + g_{m\_SFN}}$$ Equation 4

With respect to the other half of the differential circuitry (i.e. the second half shown in FIG. 5B) and making the same assumption regarding the transconductances and output conductances, the positive output signal VOUTP of the LO buffer 404 for small input signals can be approximated as per Equation 5 below:

Simplification of the positive output signal
VOUTP of the buffer 404 for small input signals $$V_{OUTP} \approx \frac{(g_{m\_SFP} + g_{m\_SFN})V_{INP} - (g_{m\_CSP} + g_{m\_CSN})V_{INN}}{Y_L + g_{m\_SFP} + g_{m\_SFN}}$$ Equation 5

From Equations 4 and 5, it is possible to solve the gains for a differential signal (VINP−VINN) and for a common-mode signal (VINP+VINN) at the input of the buffer 404. The differential signal gain $G_{DM}$ is given as per Equation 6 below:

Differential signal gain $G_{DM}$ of the buffer 404

$$G_{DM} = \frac{V_{OUTP} - V_{OUTN}}{V_{INP} - V_{INN}} = \frac{(g_{m\_SFP} + g_{m\_SFN}) + (g_{m\_CSP} + g_{m\_CSN})}{Y_L + g_{m\_SFP} + g_{m\_SFN}}$$ Equation 6

Conversely, the common-mode signal gain $G_{CM}$ is given as per Equation 7 below:

Common-mode signal gain $G_{CM}$ of the buffer 404

$$G_{CM} = \frac{V_{OUTP} + V_{OUTN}}{V_{INP} + V_{INN}} = \frac{(g_{m\_SFP} + g_{m\_SFN}) - (g_{m\_CSP} + g_{m\_CSN})}{Y_L + g_{m\_SFP} + g_{m\_SFN}} \quad \text{Equation 7}$$

It can be seen from Equation 7 that by setting the sums of the transconductances of each complementary stage to be identical such that $g_{m\_SFP}+g_{m\_SFN}=g_{m\_CSP}+g_{m\_CSN}$, the common-mode signal gain $G_{CM}$ can be reduced ideally to zero, resulting in perfect cancellation of common-mode signals at output as per Equations 8 and 9 below:

Differential signal gain $G_{DM}$ of the buffer 404 when the sums of the transconductances in the CS and SF stages are equal $$G_{DM}\{g_{m_{SFP}} + g_{m_{SFN}} = g_{m_{CSP}} + g_{m_{CSN}}\} = \frac{2(g_{m\_CSP} + g_{m\_CSN})}{Y_L + g_{m\_SFP} + g_{m\_SFN}} \quad \text{Equation 8}$$

Common-mode signal gain $G_{CM}$ of the buffer 404 when the sums of the transconductances in the CS and SF stages are equal $$G_{CM}\{g_{m_{SFP}} + g_{m_{SFN}} = g_{m_{CSP}} + g_{m_{CSN}}\} = 0 \quad \text{Equation 9}$$

Thus with the LO buffer 404 in accordance with embodiments of the present invention, by designing the sum of transconductances of the complementary source-follower stages 408, 412 to be equal to the sum of transconductances of the complementary common-source stages 406, 410 it is possible to simultaneously achieve gain for the wanted differential signal and to reject the unwanted common-mode signal.

Figure 6:
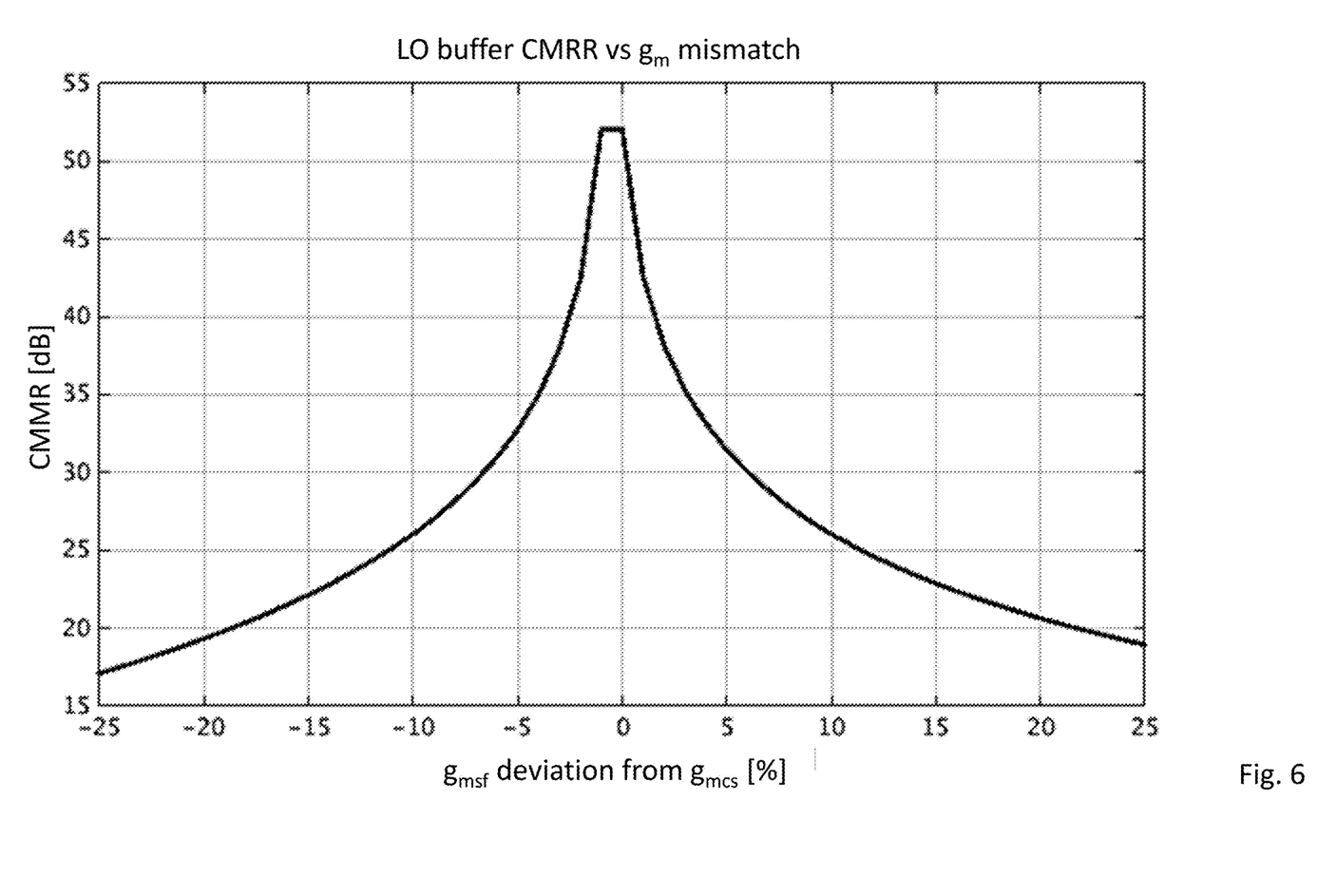
FIG. 6 is a graph showing the CMRR as a function of the mismatch in transconductance between the CS and SF stages.

FIG. 6 is a graph that demonstrates the calculated achievable CMRR in decibels as a function of the mismatch in the complementary SF and CS gain stage transconductances according to Equations 6 and 7. Even with a 25% mismatch, a CMRR greater than 17 dB may be possible. It should be noted, however, that the practical achievable CMRR may also be limited by the capacitive effects of the real buffer circuitry which are not considered in the presented simplified equations.

Figure 7:
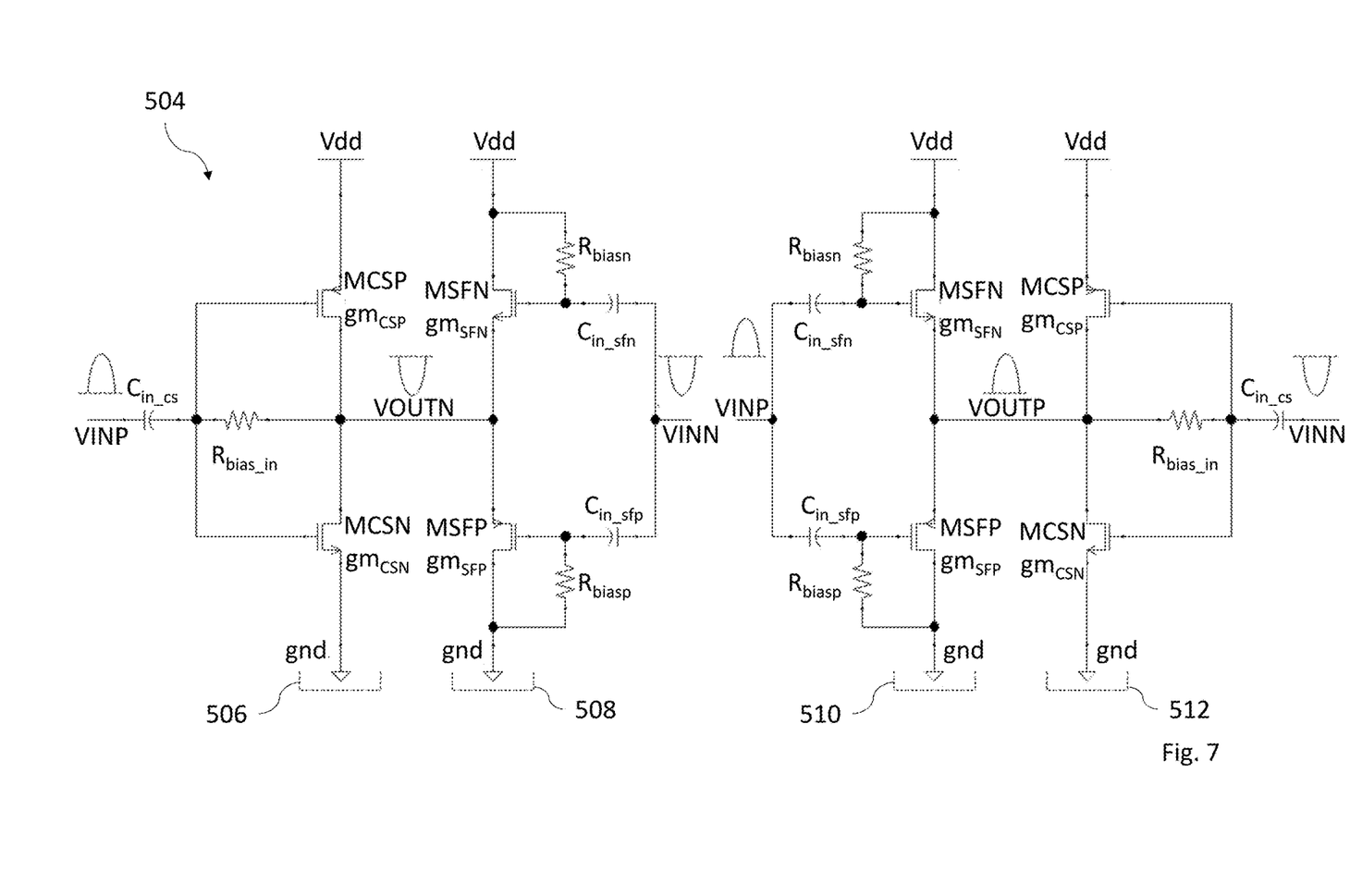
FIG. 7 is a circuit diagram of a particular implementation of a differential LO buffer circuit in accordance with an embodiment of the present invention.

FIG. 7 shows an adapted implementation of the LO buffer 504 with high common-mode rejection, where FIG. 7 shows the complete fully differential arrangement. Components having like reference numerals and labels correspond in structure and function to those described previously.

In this arrangement each of the complementary common-source gain stages 506, 512 is self-biased with a biasing resistor $R_{biasin}$ placed in feedback over the CS gain stage 506, 512, i.e. connected between the input and output nodes of the CS gain stage 506, 512.

In addition, in order to simplify the biasing of each of the complementary source-follower stages 508, 510, the gate terminals of the NMOS and PMOS devices of the SF stage 508, 510 are connected to the positive power supply Vdd and to ground gnd, respectively. To achieve optimal common-mode rejection performance, the sizes of the MOS devices are selected so that the sum of transconductances in the complementary CS and complementary SF stages are equal (i.e. $g_{m\_SFP}+g_{m\_SFN}=g_{m\_CSP}+g_{m\_CSN}$), as outlined previously.

It will, of course, be appreciated that other biasing arrangements are also possible.

It can be seen that embodiments of the present invention may provide a significant improvement for the common-mode rejection of the LO buffer used as a part of LO chain, e.g. in a high-performance transceiver. The attenuation of common-mode signals in the LO buffer results in smaller phase errors in the subsequent frequency dividers which in turn improves image-rejection or harmonic-rejection capability of RF mixers in the receiver (RX) and transmitter (TX) paths. In addition, the rejection of common-mode signals in the LO chain reduces generation of unwanted spurs and sidebands at the output of the RF mixers.

The LO buffer topology of the present invention is well-suited for integration in modern CMOS fabrication processes that utilise low power supply voltages since it uses simple CMOS gain stages that can support rail-to-rail CMOS level signals. This is a benefit compared to prior art LO buffers such as those implemented with CML, which necessitate higher supply voltages especially if resistive loads for the buffers are used.

Figure 8:
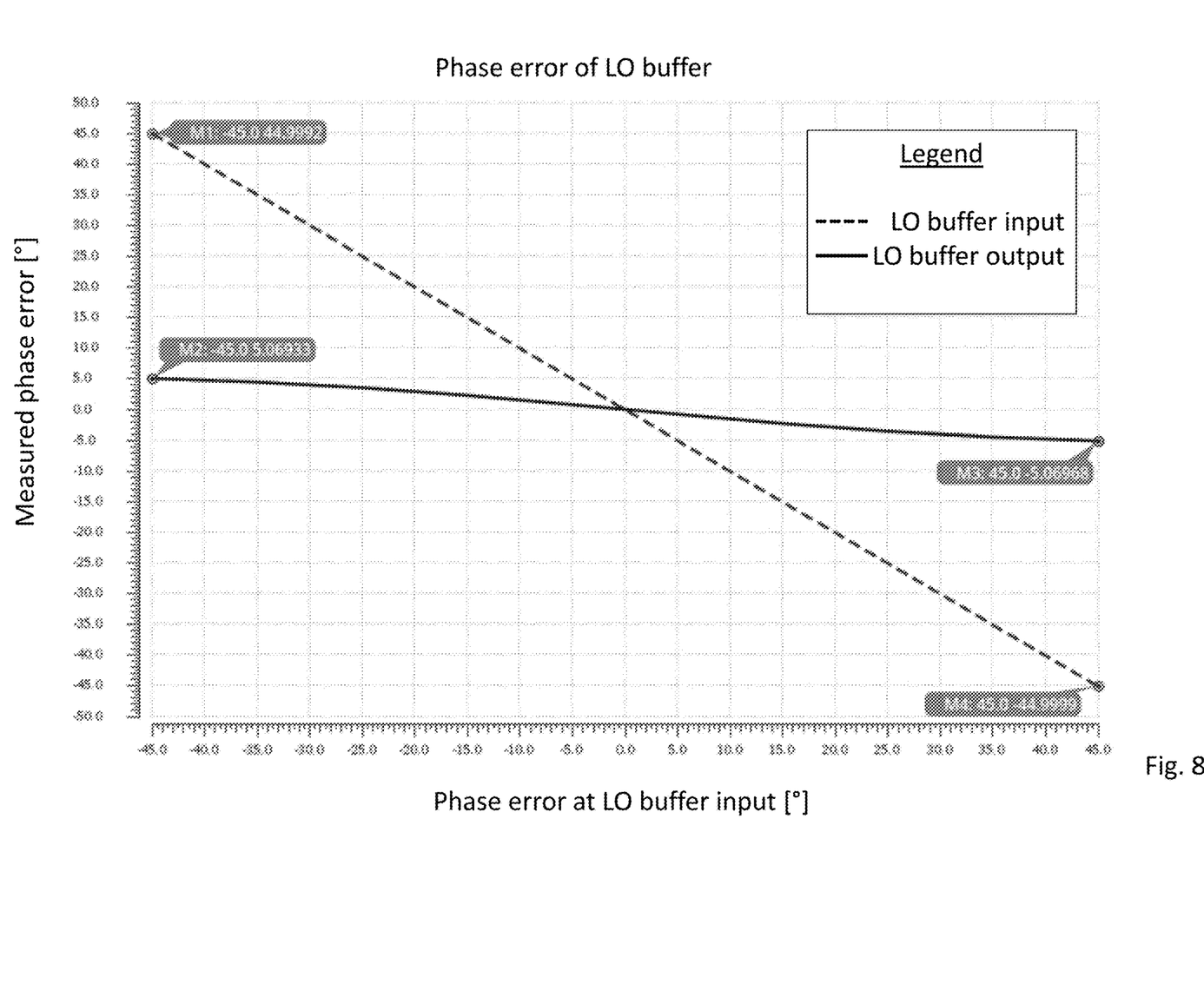
FIG. 8 is a graph showing simulation results of the output phase error as a function of the input phase error.

The phase-error correcting function of the present LO buffer is also of particular benefit, as is demonstrated with the transistor-level circuit simulation results shown in FIG. 8. In particular, in the simulation illustrated in FIG. 8, the phase error of the differential LO input signal is swept across a range from −45° to +45°. Input phase error is defined here as the deviation of the phase differential between the positive (VINP) and negative (VINN) branches of the LO signal from the ideal 180° phase shift between these. For example, a +10° phase error corresponds to a 190° phase shift between the two differential input signal branches VINP, VINN.

It can be seen from FIG. 8 that in the example simulation case the proposed LO buffer can correct an input phase error of approximately ±45° to a significantly reduced output phase error of approximately ±5°. The simulated common-mode rejection ratio for the example buffer was approximately 20 dB.

Thus it will be appreciated that embodiments of the present invention provide a buffer circuit, and a radio communication circuit comprising the same within an LO chain, that provides significant improvements in the common-mode rejection and phase error correction characteristics when compared to conventional LO buffers.

While specific embodiments of the present invention have been described in detail, it will be appreciated by those skilled in the art that the embodiments described in detail are not limiting on the scope of the claimed invention.

The invention claimed is:

1. A local oscillator buffer circuit comprising:
a complementary common-source stage comprising a first p-channel transistor and a first n-channel transistor, arranged such that a respective gate terminal of each of the first p-channel and n-channel transistors are connected together at a first input node, and a respective drain terminal of each of the first p-channel and n-channel transistors are connected together at a buffer output node; and
a complementary source-follower stage comprising a second p-channel transistor and a second n-channel transistor, arranged such that a respective gate terminal of each of the second p-channel and n-channel transistors are connected together at a second input node, and a respective source terminal of each of the second p-channel and n-channel transistors are connected together at the buffer output node.

2. The local oscillator buffer circuit as claimed in claim 1, wherein a sum of the respective transconductances of the first p-channel transistor and the first n-channel transistor is substantially equal to a sum of the respective transconductances of the second p-channel transistor and the second n-channel transistor.

3. The local oscillator buffer circuit as claimed in claim 1, a sum of the respective transconductances of the first p-channel transistor and the first n-channel transistor is greater than a sum of the respective transconductances of the second p-channel transistor and the second n-channel transistor.

4. The local oscillator buffer circuit as claimed in claim 1, further comprising:
   a second complementary common-source stage comprising a third p-channel transistor and a third n-channel transistor, arranged such that a respective gate terminal of each of the third p-channel and n-channel transistors are connected together at a third input node, and a respective drain terminal of each of the third p-channel and n-channel transistors are connected together at a second buffer output node; and
   a second complementary source-follower stage comprising a fourth p-channel transistor and a fourth n-channel transistor, arranged such that a respective gate terminal of each of the fourth p-channel and n-channel transistors are connected together at a fourth input node, and a respective source terminal of each of the fourth p-channel and n-channel transistors are connected together at the second buffer output node;
   wherein the buffer circuit is arranged to receive a differential input comprising a positive input signal and a negative input signal, wherein the positive input signal is supplied to the first and fourth input nodes, and wherein the negative input signal is supplied to the second and third input nodes.

5. The local oscillator buffer circuit as claimed in claim 4, wherein a sum of the respective transconductances of the third p-channel transistor and the third n-channel transistor is substantially equal to a sum of the respective transconductances of the fourth p-channel transistor and the fourth n-channel transistor.

6. The local oscillator buffer circuit as claimed in claim 4, a sum of the respective transconductances of the third p-channel transistor and the third n-channel transistor is greater than a sum of the respective transconductances of the fourth p-channel transistor and the fourth n-channel transistor.

7. The local oscillator buffer circuit as claimed in claim 1, wherein a source terminal of the first p-channel transistor is connected to a positive supply rail, and wherein a source terminal of the first n-channel transistor is connected to a negative supply rail or ground.

8. The local oscillator buffer circuit as claimed in claim 1, wherein a drain terminal of the second n-channel transistor is connected to a positive supply rail, and wherein a drain terminal of the second p-channel transistor is connected to a negative supply rail or ground.

9. The local oscillator buffer circuit as claimed in claim 1, wherein the common-source stage comprises a bias resistor connected to the first input terminal.

10. The local oscillator buffer circuit as claimed in claim 9, wherein the bias resistor is arranged such that a first terminal of said bias resistor is connected to the input node of the common-source stage, and such that a second terminal of said bias resistor is connected to a common-source stage bias voltage.

11. The local oscillator buffer circuit as claimed in claim 9, wherein the bias resistor is arranged such that a first terminal of said bias resistor is connected to the input node of the common-source stage, and such that a second terminal of said bias resistor is connected to the buffer output node.

12. The local oscillator buffer circuit as claimed in claim 1, wherein the gate terminal of the second p-channel transistor is connected to a respective bias voltage via a first terminal of a respective bias resistor, optionally wherein a second terminal of said bias resistor is connected to a negative supply rail or ground.

13. The local oscillator buffer circuit as claimed in claim 1, wherein the gate terminal of the second n-channel transistor is connected to a respective bias voltage via a first terminal of a respective bias resistor, optionally wherein a second terminal of said bias resistor is connected to a positive supply rail.

14. The local oscillator buffer circuit as claimed in claim 1, wherein the common-source stage comprises an input capacitor, said input capacitor having a first terminal thereof connected to the respective gate terminals of the first p-channel and n-channel transistors.

15. The local oscillator buffer circuit as claimed in claim 14, wherein a second terminal of the input capacitor is connected to an input terminal arranged to receive the input signal for the common-source stage.

16. The local oscillator buffer circuit as claimed in claim 1, wherein the source-follower stage comprises respective first and second input capacitors, wherein the first input capacitor is connected to the gate terminal of the second n-channel transistor, and the second input capacitor is connected to the gate terminal of the second p-channel transistor.

17. The local oscillator buffer circuit as claimed in claim 16, wherein a second terminal of each of the first and second input capacitors of the source-follower stage is connected to an input terminal arranged to receive the input signal for the source-follower stage.

18. The local oscillator buffer circuit as claimed in claim 1, further comprising a load conductance connected to the buffer output node.

19. A radio communication circuit comprising:
   a frequency synthesizer arranged to generate a local oscillator signal comprising a positive local oscillator input signal and a negative local oscillator input signal;
   a local oscillator buffer circuit comprising:
      a complementary common-source stage comprising a first p-channel transistor and a first n-channel transistor, arranged such that a respective gate terminal of each of the first p-channel and n-channel transistors are connected together at a first input node arranged to receive the positive local oscillator input signal, and a respective drain terminal of each of the first p-channel and n-channel transistors are connected together at a buffer output node; and
      a complementary source-follower stage comprising a second p-channel transistor and a second n-channel transistor, arranged such that a respective gate terminal of each of the second p-channel and n-channel transistors are connected together at a second input node arranged to receive the negative local oscillator input signal, and a respective source terminal of each of the second p-channel and n-channel transistors are connected together at the buffer output node.

20. The radio communication circuit as claimed in claim 19, further comprising a frequency divider connected to the output of the LO buffer circuit.

21. The radio communication circuit as claimed in claim 20, wherein the frequency divider comprises a divide-by-two frequency divider arranged to receive positive and negative local oscillator signal outputs from the LO buffer and to generate four resultant signals: a positive in-phase LO signal; a negative in-phase LO signal; a positive quadrature LO signal; and a negative quadrature LO signal.

22. The radio communication circuit as claimed in claim 20, further comprising a frequency mixer arranged to receive the output of the frequency divider, optionally wherein the radio communication circuit comprises one or more mixer local buffers connected between the frequency divider and the frequency mixer.

* * * * *